United States Patent
Xiao et al.

(10) Patent No.: US 9,793,517 B2
(45) Date of Patent: Oct. 17, 2017

(54) ORGANIC LIGHT EMITTING DIODE DISPLAY PANEL AND DISPLAY DEVICE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Ang Xiao, Beijing (CN); Xiangdong Qin, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/093,677

(22) Filed: Apr. 7, 2016

(65) Prior Publication Data

US 2016/0329517 A1 Nov. 10, 2016

(30) Foreign Application Priority Data

May 8, 2015 (CN) .......................... 2015 1 0233021

(51) Int. Cl.
*H01L 51/52* (2006.01)
*H01L 27/32* (2006.01)

(52) U.S. Cl.
CPC ........ *H01L 51/529* (2013.01); *H01L 27/3276* (2013.01); *H01L 51/5246* (2013.01)

(58) Field of Classification Search
CPC ............... H01L 51/529; H01L 27/3276; H01L 27/3262; H01L 51/5246

(Continued)

(56) References Cited

U.S. PATENT DOCUMENTS

2007/0216298 A1 9/2007 Kaneko
2012/0287026 A1* 11/2012 Masuda .............. H01L 27/3272
  345/76

FOREIGN PATENT DOCUMENTS

CN 1901221 A 1/2007
CN 101170162 A 4/2008
(Continued)

OTHER PUBLICATIONS

Chinese Reexamination Notification dated Aug. 30, 2016, for corresponding Chinese Application No. 201510233021.2.

(Continued)

*Primary Examiner* — Fernando L Toledo
*Assistant Examiner* — Adam S Bowen
(74) *Attorney, Agent, or Firm* — Kinney & Lange, P.A.

(57) ABSTRACT

An organic light emitting diode (OLED) display panel and a display provided with the same are disclosed in the embodiments, for decreasing the distance between a frit layer and a display area, on the OLED display panel such that an OLED display product with slim bezel is obtained; the OLED display panel provided by the embodiments includes substrate glass, cover glass, and the frit layer arranged between the substrate glass and the cover glass, as well as a display area, which is enclosed by the frit layer, arranged on the substrate glass and overlaid with the cover glass, wherein the OLED display panel further includes a heat radiator arranged between the display area and the frit layer, at least one portion of the heat radiator lying within a laser illumination area for laser sintering of the frit layer, and the display area not intersecting with the laser illumination area.

9 Claims, 4 Drawing Sheets

(58) Field of Classification Search
USPC .......................................................... 257/40
See application file for complete search history.

(56) References Cited

FOREIGN PATENT DOCUMENTS

| | | |
|---|---|---|
| CN | 102024421 A | 4/2011 |
| CN | 102754524 A | 10/2012 |
| JP | 2007053030 A | 3/2007 |

OTHER PUBLICATIONS

English translation of first Chinese Office Action received for Chinese Application No. 201510233021.2 (2015).
English translation of second Chinese Office Action received for Chinese Application No. 201510233021.2 (2016).
Third Chinese Office Action, for Chinese Patent Application No. 2015102330212, dated Dec. 23, 2016, 12 pages.
Fourth Chinese Office Action, for Chinese Patent Application No. 201510233021.2, dated Mar. 15, 2017, 9 pages.

\* cited by examiner

ORGANIC LIGHT EMITTING DIODE DISPLAY PANEL AND DISPLAY DEVICE

CROSS-REFERENCE TO RELATED INVENTION

The present application claims the benefit of Chinese Patent Invention No. 201510233021.2 filed on May 8, 2015 in the State Intellectual Property Office of China, the whole disclosure of which is incorporated herein by reference.

BACKGROUND OF THE INVENTION

Field of the Invention

Embodiments of the present invention relate to the technical field of display device, and in particular, to an organic light emitting diode display panel and a display device with the same.

Description of the Related Art

OLED ("Organic Light-Emitting Diode") display is also referred to as Organic Electroluminescence display and is a product different from TFT-LCD (Thin Film Transistor Liquid Crystal Display).

OLED device is a self-luminescent display device which is driven by the current passing through a luminescent material so as to emit light autonomously. It was found that appropriate operation of the internal components' structures of OLED device may be guaranteed for a long run by excellent encapsulation thereof, i.e., reliable sealing property. In the prior art, packaging technology with frit is widely adopted, in which a laser sintering process which is commonly utilized plays a crucial role in ensuring the sealing property of the frit.

In existing designs, in order to eliminate any damage arisen during the laser sintering process to the internal components inside the OLED panel, i.e., components within a display area of the OLED panel, then it is necessary that there is a distance between the frit and the display area. As illustrated in FIG. 1, a structure of Organic Light-Emitting Diode display panel, e.g. in the display technical field, of a conventional design is shown by way of example, wherein a laser illumination area 11 is wider than a frit layer 12 actually applied for packaging and a lower gate metal layer 13 located beneath the frit layer 12, and the frit layer 12 and the lower gate metal layer 13 are both covered by the laser illumination area 11. In order to eliminate exposure of the surrounding area of the laser illumination area 11 to laser irradiation, i.e., to avoid overheating of the component units arranged within the display area 14, for example, component units such as CTD15 and PLN16, then, a distance "d" between the frit 12 and CTD15 in a direction in parallel with a substrate glass of the OLED panel is necessarily above a critical value/threshold, for example, between 0.3 and 0.5 mm. Moreover, the substrate glass 10 is positioned as the lowest layer, and a cover glass is omitted from the drawings, for clarity.

However, with a trend that the bezel of the display panel is getting slimmer continuously so as to obtain more aesthetic appearance, it is necessary for facilitating the design of slim bezel display product to reduce the distance "d" between the frit and any component unit within the display area. Nevertheless, in the prior art, the distance between the frit and the display area tends to be excessively large in conventional OLED display panel, which is adverse to the implementation of a slim bezel display product.

SUMMARY OF THE INVENTION

The embodiments of the present invention have been made to overcome or alleviate at least one aspect of the above mentioned disadvantages and/or shortcomings. An organic light emitting diode display panel and a display device with the same are provided in the exemplary embodiments of the present invention, which are capable of providing a decreased distance "d" between the frit and the display area of the OLED display panel, so as to obtain a slim bezel OLED display product.

Following technical solutions are adopted for providing the above desired products.

According to an aspect of the exemplary embodiment of the present invention, there is provided an organic light emitting diode (OLED) display panel, comprising substrate glass, cover glass, a frit layer arranged between the substrate glass and the cover glass, and a display area arranged on the substrate glass and overlaid with the cover glass, wherein the OLED display panel further comprises a heat radiator arranged between the display area and the frit layer, at least one portion of the heat radiator lying within a laser illumination area for laser sintering of the frit, and the display area not intersecting with the laser illumination area.

According to another exemplary embodiment of the present invention, an OLED display comprising the OLED display panel is also provided, accordingly, comprising aforementioned OLED display panel.

BRIEF DESCRIPTION OF THE DRAWINGS

The above and other features and advantages of the present invention will become more apparent and a more comprehensive understanding of the present invention can be obtained, by describing in detail exemplary embodiments thereof with reference to the accompanying drawings, in which.

DETAILED DESCRIPTION OF PREFERRED EMBODIMENTS OF THE INVENTION

Figure 1:
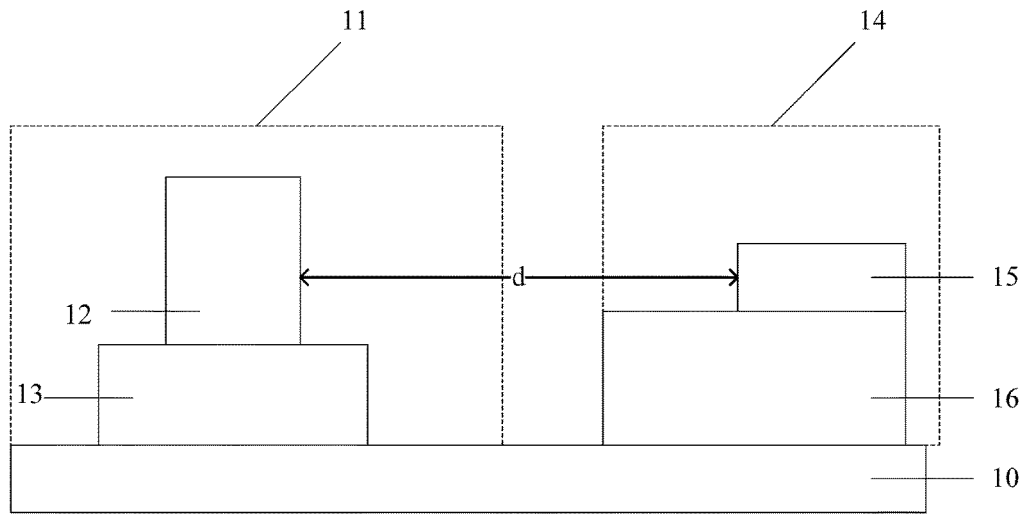
FIG. 1 illustrates a structural schematic view of existing OLED panel.

An organic light emitting diode display panel and a display device with the same are provided in the exemplary embodiments of the present invention, which are capable of providing a decreased distance "d" between the frit and the display area of the OLED display panel, so as to obtain a slim bezel OLED display product.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the invention in view of attached drawings should not be construed as being limited to the embodiments set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective thickness and shape of each layer in the drawings are only intended to exemplarily illustrate the contents of the disclosure, rather than to demonstrate the practical dimension or proportion of components of the OLED display panel.

Figure 2:
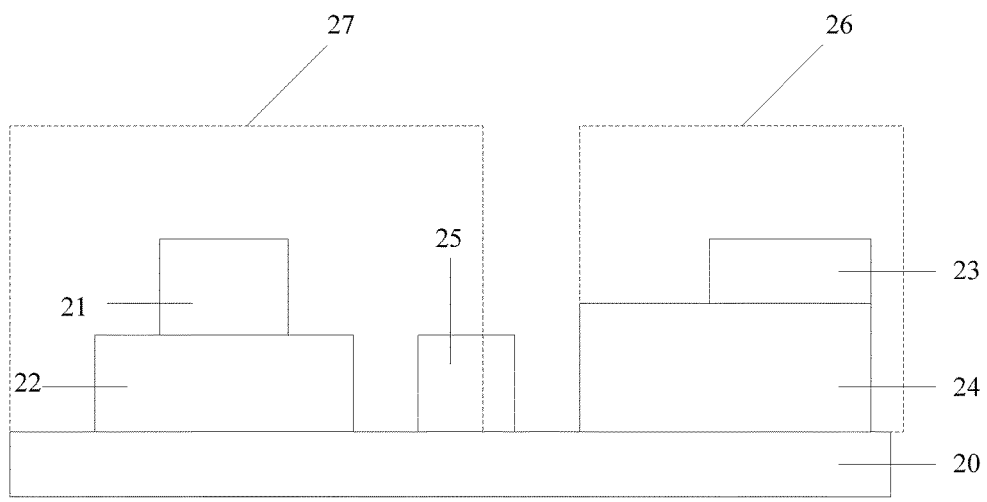
FIG. 2 illustrates a structural schematic view of an exemplary OLED panel according to one exemplary embodiment of the present invention.

According to a general technical concept of the present invention, as shown in FIG. 2, there is provided an organic light emitting diode display panel, comprising: substrate glass 20, cover glass (which is located as a uppermost layer but not shown, due to removal for clearer illustration), a frit layer 21 arranged between the substrate glass and the cover glass, and a display area 26 which is encapsulated by the frit layer and overlaid with the cover glass, on the substrate glass 20, as well as component units CTD 23 and PLN 24 both of which are located within the display area 26, wherein the frit 21 is located on a gate metal layer 22 which is formed on upper surface of the substrate glass, and the frit layer 21 and the lower gate metal layer 22 is contained within a laser illumination area 27 upon the laser sintering of the frit, and the display area 26 fails to intersect with the laser illumination area 27. The OLED display panel further comprises a heat radiator 25 arranged between the display area 26 and the frit layer 21, at least one portion of the heat radiator lying within the scope of the laser illumination area.

The OLED display panel disclosed in the exemplary embodiments of the invention dissipates the heat produced during the laser sintering of the frit, by the heat radiator 25 arranged between the display area and the frit layer, alleviating the effect of the heat produced by such laser sintering on the internal components within the display area, especially on the dimension thereof. Therefore, it is possible that the distance between the frit and the display area is to be decreased, so as to obtain a slim bezel OLED display product.

Figure 3:
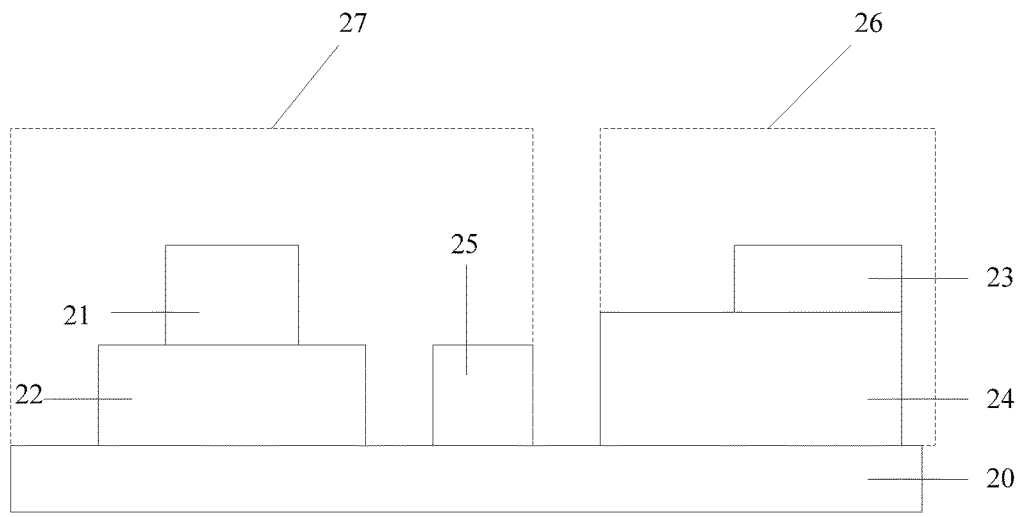
FIG. 3 illustrates a structural schematic view of a second exemplary OLED panel according to one exemplary embodiment of the present invention.

As illustrated in FIG. 3, the heat radiator 25 may also be completely located within the laser illumination area 27, for example.

Figure 4:
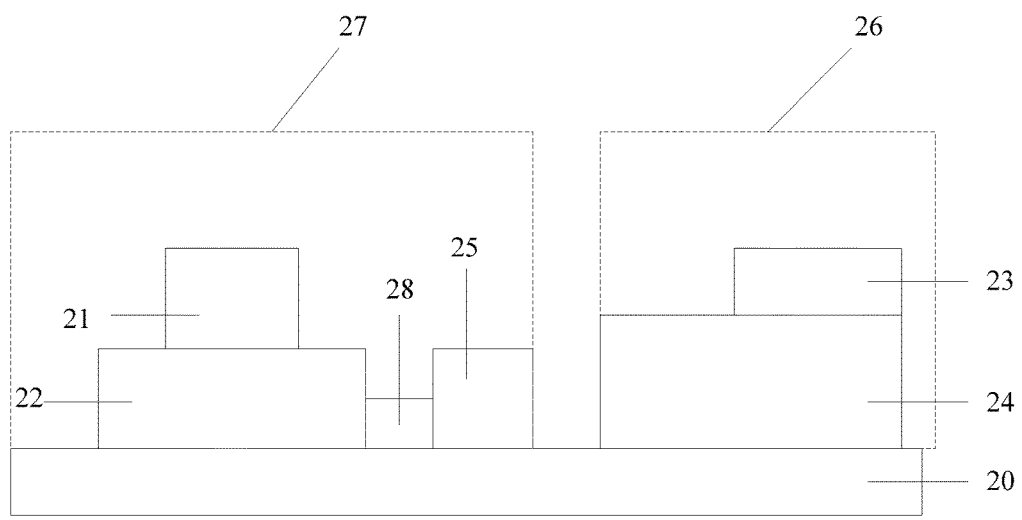
FIG. 4 illustrates a structural schematic view of a third exemplary OLED panel according to one exemplary embodiment of the present invention.

By way of example, as shown in FIG. 4, the OLED display panel provided by the embodiments of the invention further comprises a heat-conductive strip connecting the heat radiator 25 with the gate metal layer 22 located between the lower side of the frit layer 21 and the upper surface of the substrate glass.

With such heat-conductive strip, it is possible that the heat absorbed by the heat radiator is to be transferred back to the gate metal layer 22, which in turn heats the frit 21. Thereby the heat produced during the laser sintering is sufficiently recycled and recovered, accelerating the melting of the frit while enhancing the heat utilization and working efficiency.

In an exemplary embodiment of the invention, the heat radiator and the heat-conductive strip are arranged in a same layer in which the gate metal layer is also located. Thereby, the heat radiator and the heat-conductive strip may be manufactured simultaneously when the gate metal layer is manufactured, for example, thus reducing the process steps.

In another exemplary embodiment of the invention, the heat radiator and the heat-conductive strip are arranged in a same layer in which a source/drain metal layer is also located, for example, and the heat-conductive strip is connected with the gate metal layer by a via-hole or via-holes. Thereby, the heat radiator and the heat-conductive strip may be manufactured simultaneously when the source/drain metal layer is manufactured, thus reducing the process steps.

In still another exemplary embodiment of the invention, when there is no such heat-conductive strip, it is possible that the heat radiator is also arranged in a same layer in which the gate metal layer or the source/drain metal layer is located, for example. Thereby, the heat radiator may be manufactured simultaneously when the gate metal layer or the source/drain metal layer is manufactured, thus reducing the process steps.

By way of example, the heat radiator occupies a space with a width ranging from 50 to 100 um, in a gap between the display area and the frit.

Figure 5:
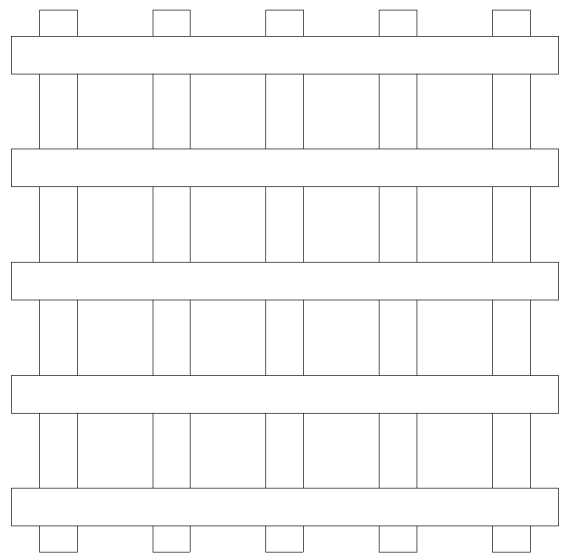
FIG. 5 illustrates a structural schematic view of a heat radiator according to one exemplary embodiment of the present invention.
Figure 6:
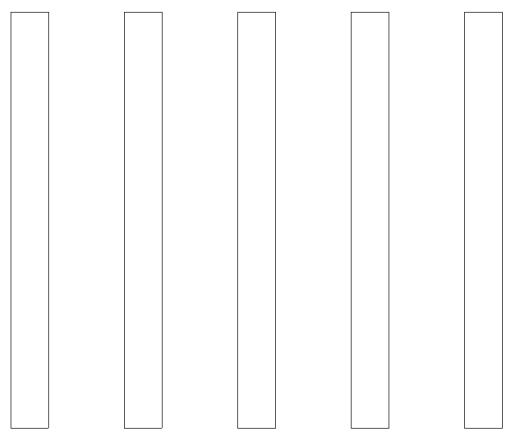
FIG. 6 illustrates a structural schematic view of another heat radiator according to one exemplary embodiment of the present invention.

In an exemplary embodiment of the invention, as shown in FIG. 5, the heat radiator is provided with a mesh-grid shaped construction, or as shown in FIG. 6, a comb shaped construction consisting of a plurality of bars in parallel with one another. Such constructions are more favorable for heat dissipation.

Figure 7:
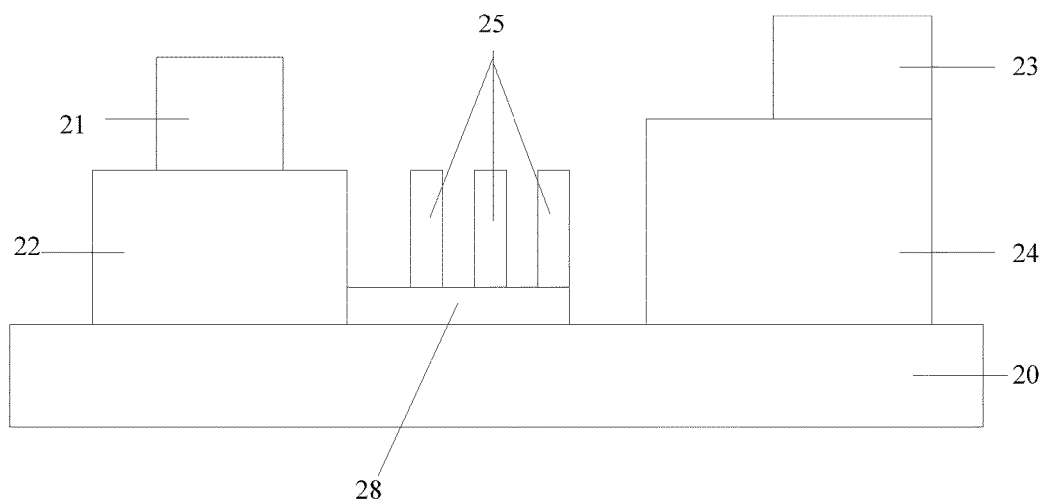
FIG. 7 illustrates a structural schematic view of a fourth exemplary OLED panel according to one exemplary embodiment of the present invention.

When the heat radiator is a comb shaped construction consisting of a plurality of mutually parallel bars, as can be seen in FIG. 7, the profile sectional structure of the OLED display panel of an exemplary embodiment of the invention is provided. It should be noticed that, there is no limitation on the specific number and shape of the bar-structure constituting the heat radiator in the exemplary embodiments, i.e., any heat radiator of comb shaped construction comprising mutually parallel bar structures is usable, only if heat dissipation function is provided therewith.

In an exemplary embodiment of the invention, there is a heat radiator provided between the gate metal and the edge of the illumination area, with a width between 50 and 100 um. And the material of the heat radiator is such as source/drain metal, gate metal and so on. In case that the gate metal is adopted for the heat radiator, the heat radiator for example of a hot-well structure and a heat conductive strip are formed simultaneously. A hot-well structure is of a mesh-grid shaped construction; and upon the illumination of the laser thereon, since multiple reflection of the incident laser may take place among the bars of the grid thereof, then the laser heat is transferred onto the metal of the heat radiator of the hot well structure to a maximum extent and in turn transferred onto the gate metal layer via the heat conductive strip. One portion of the heat energy received by the gate metal assists in heating the upper frit, while another portion of the received heat is radiated into ambient air. Due to the existence of the heat radiator, the heat received by the internal components inside the display is decreased significantly; therefore, it is possible to reduce the distance between the frit layer and the CTD in the design of the display panel, for facilitating the design of a slim bezel display. Similarly, in case that the source/drain metal is adopted for the heat radiator, i.e., the hot-well structure is formed by the source/drain metal, the heat conductive strip is also formed by the source/drain metal connecting with the lower gate metal layer through a via-hole or via-holes, depending on the same principle.

Accordingly, an OLED display which comprises one of the aforementioned OLED display panels provided by previous exemplary embodiments of the invention is further provided in an exemplary embodiment.

In yet another exemplary embodiment of the invention, there is a heat radiator of metallic material provided between the frit and the display area, and also referred to as "heat dissipation metal", which is formed of a cathode metal layer, an anode metal layer, a gate metal layer or a source/drain metal layer by vapor deposition in the same layer, by way of example. The heat dissipation metal functions to dissipate heat during the laser sintering of the frit, thus decreasing the heating to the internal components of the display. In the prior art, the distance between the frit and the display area is usually more than 0.6 mm. In an exemplary embodiment of the invention, such distance is reduced by addition of a heat dissipation layer in the order of 100 um, contributing to the implementation of a design of the slim bezel display product.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present invention exemplarily, and should not be deemed as a restriction thereof.

Although several exemplary embodiments of the general concept of the present invention have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An organic light emitting diode (OLED) display panel, comprising:
    substrate glass, cover glass, and a frit layer arranged between the substrate glass, the cover glass, and a display area arranged on the substrate glass and overlaid with the cover glass,
    wherein the OLED display panel further comprises a heat radiator arranged between the display area and the frit layer, at least one portion of the heat radiator lying within a laser illumination area for laser sintering of the frit layer, and the display area not intersecting with the laser illumination area and
    wherein the heat radiator is configured to be spaced apart from and not overlapped with the frit layer.

2. The OLED display panel according to claim 1, further comprising a gate metal layer located between the lower side of the frit layer and the upper surface of the substrate glass.

3. The OLED display panel according to claim 1, further comprising a heat-conductive strip connecting the heat radiator with a gate metal layer beneath the frit layer.

4. The OLED display panel according to claim 3, wherein the heat radiator and the heat-conductive strip are arranged in a same layer in which the gate metal layer is also located.

5. The OLED display panel according to claim 3, wherein the heat radiator and the heat-conductive strip are arranged in a same layer in which a source/drain metal layer is also located, and the heat-conductive strip is connected with the gate metal layer by a via-hole.

6. The OLED display panel according to claim 1, wherein the heat radiator is arranged in a same layer in which one of a gate metal layer and a source/drain metal layer is also located.

7. The OLED display panel according to claim 1, wherein the heat radiator has a width ranging from 50 to 100 um, in a gap between the display area and the frit layer.

8. The OLED display panel according to claim 1, wherein the heat radiator is provided with a construction selected from a group consisting of a mesh-grid shaped construction, and a comb shaped construction comprising a plurality of mutually parallel bars.

9. An OLED display comprising the OLED display panel according to claim 1.

* * * * *